US006515522B2

(12) United States Patent
Inada et al.

(10) Patent No.: US 6,515,522 B2
(45) Date of Patent: Feb. 4, 2003

(54) DRIVE CIRCUIT OF CAPACITIVE LOAD AND INTEGRATED CIRCUIT FOR DRIVING CAPACITIVE LOAD

(75) Inventors: Yoshiaki Inada, Tokorozawa (JP); Masaaki Shibasaki, Edogawa-ku (JP)

(73) Assignee: Nippon Precision Circuits, Inc. (JP)

( * ) Notice: Subject to any disclaimer, the term of this patent is extended or adjusted under 35 U.S.C. 154(b) by 0 days.

(21) Appl. No.: 09/865,613

(22) Filed: May 25, 2001

(65) Prior Publication Data

US 2002/0000850 A1 Jan. 3, 2002

(30) Foreign Application Priority Data

May 29, 2000 (JP) ...................................... 2000/157741

(51) Int. Cl.[7] ................................................ H03K 3/00
(52) U.S. Cl. ....................... 327/111; 327/108; 327/547
(58) Field of Search ................................ 327/111, 108, 327/124, 306, 404, 547; 345/76, 77; 315/312–315, 291, 200 R, 209 R, 227 R

(56) References Cited

U.S. PATENT DOCUMENTS 5,347,198 A * 9/1994 Kimball ...................... 315/167
5,418,434 A * 5/1995 Kamens et al. .......... 315/169.3
5,519,288 A * 5/1996 Tatsumi et al. .......... 315/169.3
5,581,160 A * 12/1996 Fujita ...................... 315/169.3
5,686,797 A * 11/1997 Sanderson .............. 315/209 R
5,821,701 A * 10/1998 Teggatz et al. ............ 315/307
5,982,105 A * 11/1999 Masters .................. 315/169.3
6,046,614 A * 4/2000 Takahasi ..................... 327/111
6,160,490 A * 12/2000 Pace et al. ............ 340/825.44

* cited by examiner

*Primary Examiner*—Timothy P. Callahan
*Assistant Examiner*—Hai L. Nguyen
(74) *Attorney, Agent, or Firm*—Joel E. Lutzker; Donna L. Angotti; Schulte Roth & Zabel, LLP

(57) ABSTRACT

A drive circuit capable of adjusting a capacitive load operation, for example, respective brightness of an electroluminescence (EL) element. The drive circuit is a constant current drive system and causes a plurality of capacitive loads, for example, EL elements, to emit light. This is done by setting a coil drive signal applied to the gate of a transistor Tr1. The transistor generates a surge pulse by intermittently connecting a direct current power source to a coil L1 of a step-up circuit 1. The coil drive signal is set to a frequency in accordance with an EL element as a capacitive load driven alone or a combination of EL elements simultaneously driven. Power generated by the step-up circuit 1 can be selected, brightness of a driven EL element E1 or E2 can individually be set or brightness of the EL elements E1 and E2 simultaneously driven can be set.

4 Claims, 4 Drawing Sheets

DRIVE CIRCUIT OF CAPACITIVE LOAD AND INTEGRATED CIRCUIT FOR DRIVING CAPACITIVE LOAD

FIELD OF THE INVENTION

The present invention relates to a drive circuit of a capacitive load such as an EL (electroluminescence) element or a piezoelectric oscillator, and more particularly, to a drive circuit of a capacitive load or an integrated circuit suitable for driving a plurality of EL elements.

BACKGROUND OF THE INVENTION

Conventionally, a drive circuit of a plurality of capacitive elements, for example, EL elements has the construction shown by FIG. 3. The structure is provided with a step-up circuit REG in which a coil L1 and a transistor Tr1 for driving the coil are connected in series between direct current power source terminals VDD and VSS. A surge pulse is generated at the coil L1 when the transistor Tr1 is switched on and off by a drive signal at a predetermined frequency. The surge pulse is applied to a high withstand voltage condenser C1 via a diode D1 to charge C1 by which high voltage is generated at a terminal CHV. Terminals on one side of EL elements E1 and E2, are connected with respectively exclusive constant current output circuits 31 and 32. Other terminals thereof are connected with a common constant current output circuit 33 and the constant current output circuits 31, 32 and 33 make respective EL elements emit light by using the high voltage from the step-up circuit REG. Further, an oscillator OSC generates the drive signal and a selector SEL2 controls the constant current circuits in correspondence with the EL element to emit light and applies bi-directionally output voltage to the EL elements.

Further, FIG. 4 shows another drive circuit for an EL element. In FIGS. 3 and 4 similar reference notations designate similar elements. In FIG. 4, the output voltage generated at the terminal CHV is compared with a predetermined voltage VREF by a comparator CP. A result of comparison is fed back to control the drive signal. By controlling power generated by the step-up circuit REG, the EL element is driven under constant voltage to adjust the brightness of the EL element. Further, switch circuits 41 and 42 are controlled by the selector SEL3 and bi-directionally apply output voltage respectively to the EL elements E1 and E2.

SUMMARY OF THE INVENTION

According to the drive circuit of the constant current drive system shown by FIG. 3, there is achieved an advantage that the capacitive load, for example, the EL element, does not to deteriorate or age since the capacitive element is driven by constant current. Since, power is supplied from the step-up circuit to the plurality of constant current output circuits, the respective constant current output circuits make the respective EL elements emit light, and power provided to all of the EL elements is constant. Accordingly, there poses a problem that respective brightnesses of the EL elements cannot be set individually.

Further, according to the drive circuit of the constant voltage drive system shown in FIG. 4, the output voltage to the EL element is compared with the predetermined voltage to control power generated by the step-up circuit. Accordingly, the EL element is deteriorated by ageing to reduce capacitance of the EL element. Therefore, the feedback control is operated in a direction of reducing power generated by the step-up circuit less than a value of initially using the drive circuit to reduce the brightness of the EL element.

It is an object of the invention to be capable of operating a capacitive load or adjusting respective brightness of, for example, an EL element in a drive circuit of a constant current drive system for making a plurality of capacitive loads, for example, EL elements emit light.

According to the invention, by setting a signal of driving a coil of a step-up circuit to a frequency in accordance with a driven capacitive load or a combination of the capacitive loads simultaneously driven, the output of the driven capacitive load can individually be set or the output can be set for a respective combination of the capacitive loads simultaneously driven. Thereby, for example, according to a drive circuit of EL elements for selectively driving a plurality of EL elements, respective brightness of an EL element driven by itself can be adjusted, and, brightness can be set for a respective combination of EL elements simultaneously driven.

According to an aspect of the invention, there is a drive circuit of a capacitive load comprising a step-up circuit in which a coil and a transistor are connected in series between a terminal at a first potential and a terminal at second potential lower than the first potential, a diode and a condenser are connected in series between a point of connecting the coil and the transistor and the terminal at the second potential and a surge pulse generated at the coil by switching on and off the transistor by a coil drive signal, is applied to the condenser via the diode to thereby charge the condenser by which output voltage is generated at a point of connecting the diode and the condenser, a high voltage switch output circuit for selectively driving a plurality of capacitive loads by constant current by receiving the output voltage from the step-up circuit, and a coil drive signal generating circuit for generating the coil drive signal at a frequency in correspondence with a single one of the capacitive load driven or a combination of the capacitive loads simultaneously driven by the high voltage switch output circuit.

According to another aspect of the invention, it is preferable that the coil drive signal generating circuit comprises a selecting circuit and a plurality of a oscillators, the plurality of oscillators are set to generate an oscillation output at a predetermined frequency in correspondence with either one of the plurality of capacitive loads and a combination of the capacitive loads, the selecting circuit selects the capacitive load to be driven and selects the oscillator(s) for generating a frequency in correspondence with the selected capacitive load or the combination of the capacitive loads simultaneously selected and the coil drive signal is generated based on the oscillation output from the selected oscillator.

According to another aspect of the invention, it is preferable that the capacitive load is an EL (electroluminescence) element and the coil drive signal is generated at a frequency for making the EL element(s) emit light with a predetermined brightness of one of the driven EL element or a combination of the EL elements simultaneously driven.

Further, it is preferable to provide an integrated circuit for driving a capacitive load capable.

DESCRIPTION OF THE PREFERRED EMBODIMENTS

Figure 1:
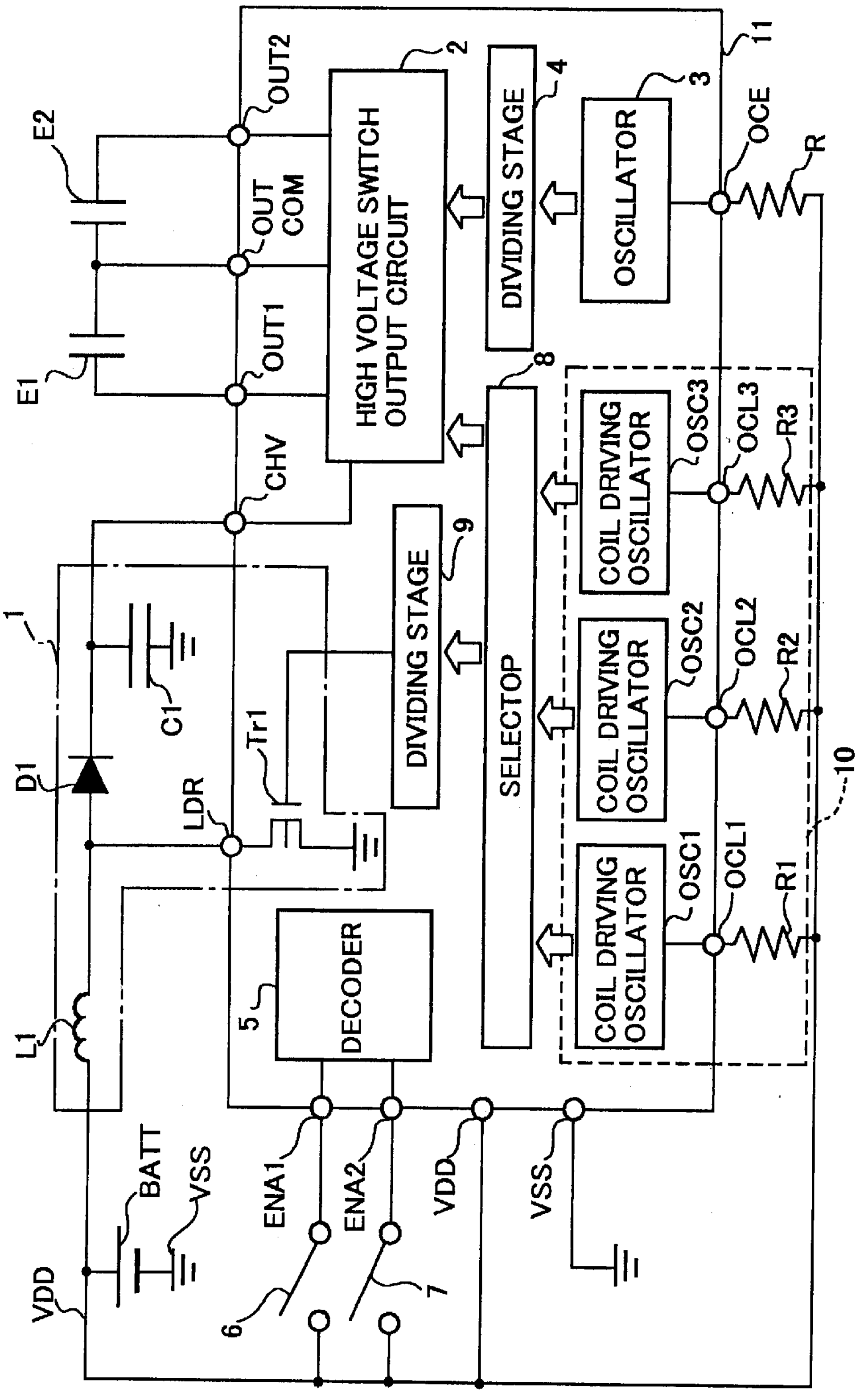
FIG. 1 is a block diagram for explaining a construction of a drive circuit of an EL element according to an embodiment of the invention.

An explanation will be given of details of a drive circuit of a capacitive load according to the invention in line with a first embodiment shown by FIG. 1 as follows. This embodiment shows a drive circuit for driving two sheets of EL elements.

Similar to the conventional circuits, a step-up circuit 1 of the first embodiment of the invention comprises coil L1 and transistor Tr1 for driving the coil which are connected in series between a power source terminal VDD (for example, 5V) on a high potential side of a direct current power source BATT and a power source terminal VSS (for example, 0V) on a low potential side thereof. The circuit of the first embodiment further comprises diode D1 where an anode of the diode D1 is connected to a point between the coil L1 and the transistor Tr1, and the high withstand voltage condenser C1 where one terminal is connected to a cathode of the diode D1 and the other terminal is connected to the power source terminal VSS. The step-up circuit generates a high voltage at the terminal CHV. The transistor Tr1 is driven by receiving a coil drive signal, described later, at a gate thereof.

Figure 2:
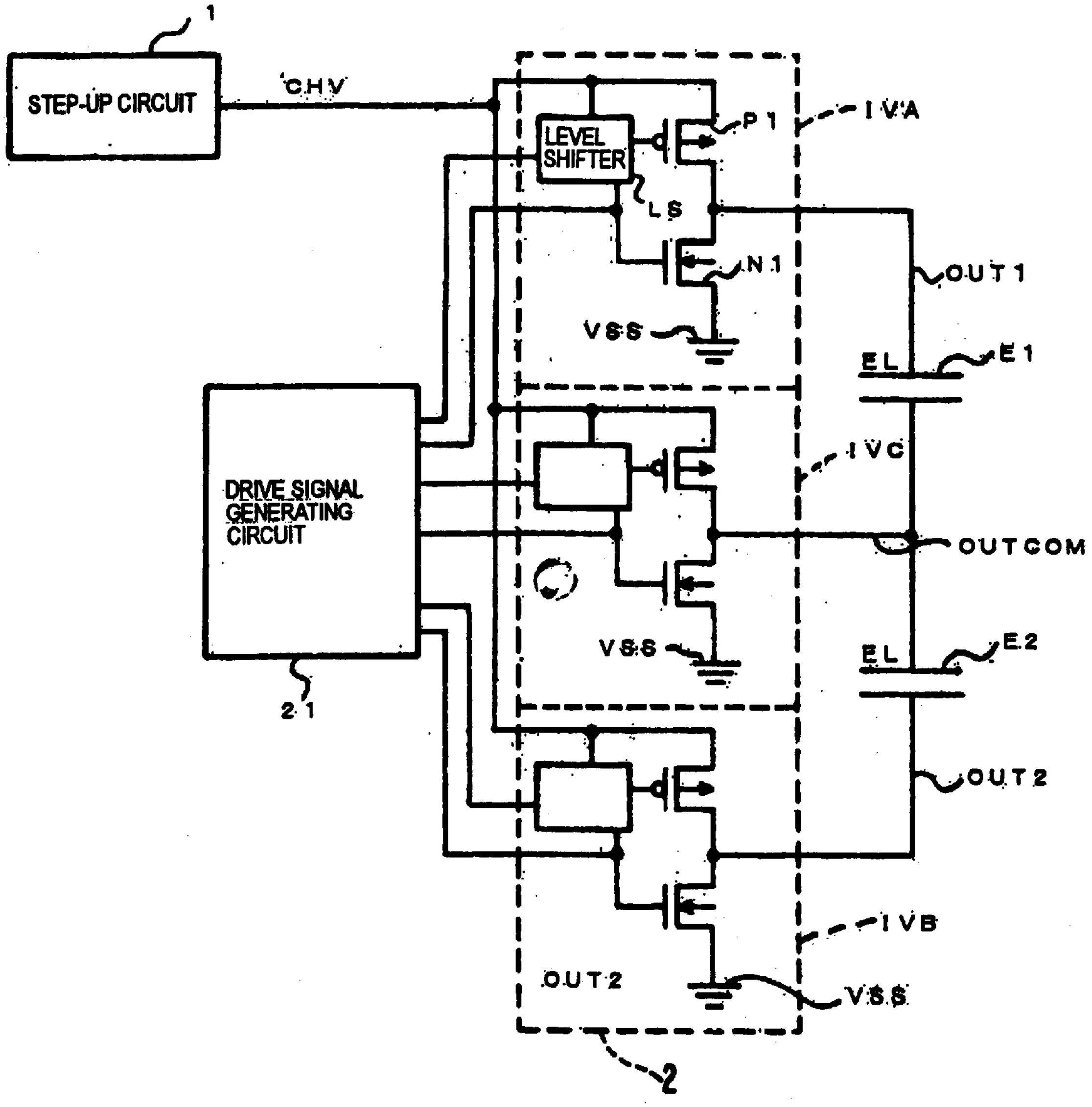
FIG. 2 is a block diagram for explaining a construction of a high voltage switch output circuit of FIG. 1.
Figure 3:
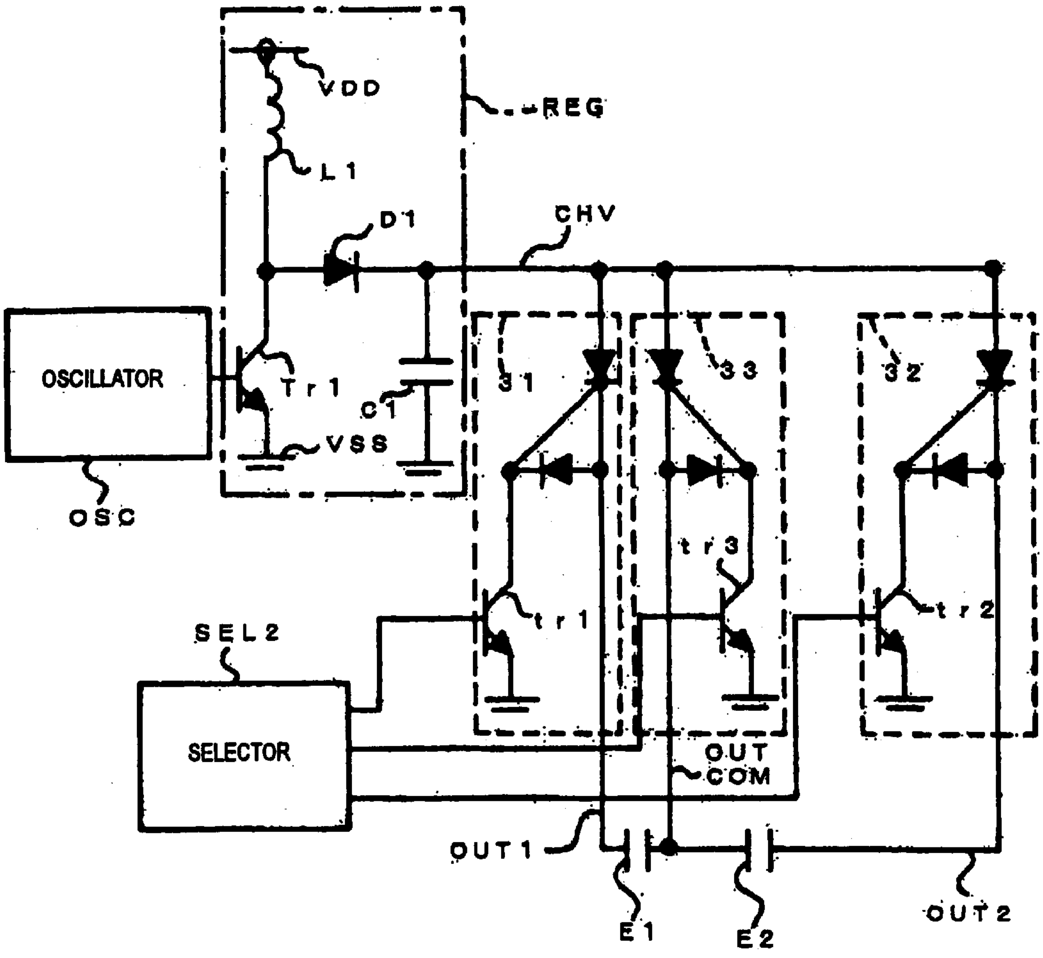
FIG. 3 PRIOR ART
FIG. 3 is a block diagram for explaining a construction of a conventional drive circuit of an EL element.
Figure 4:
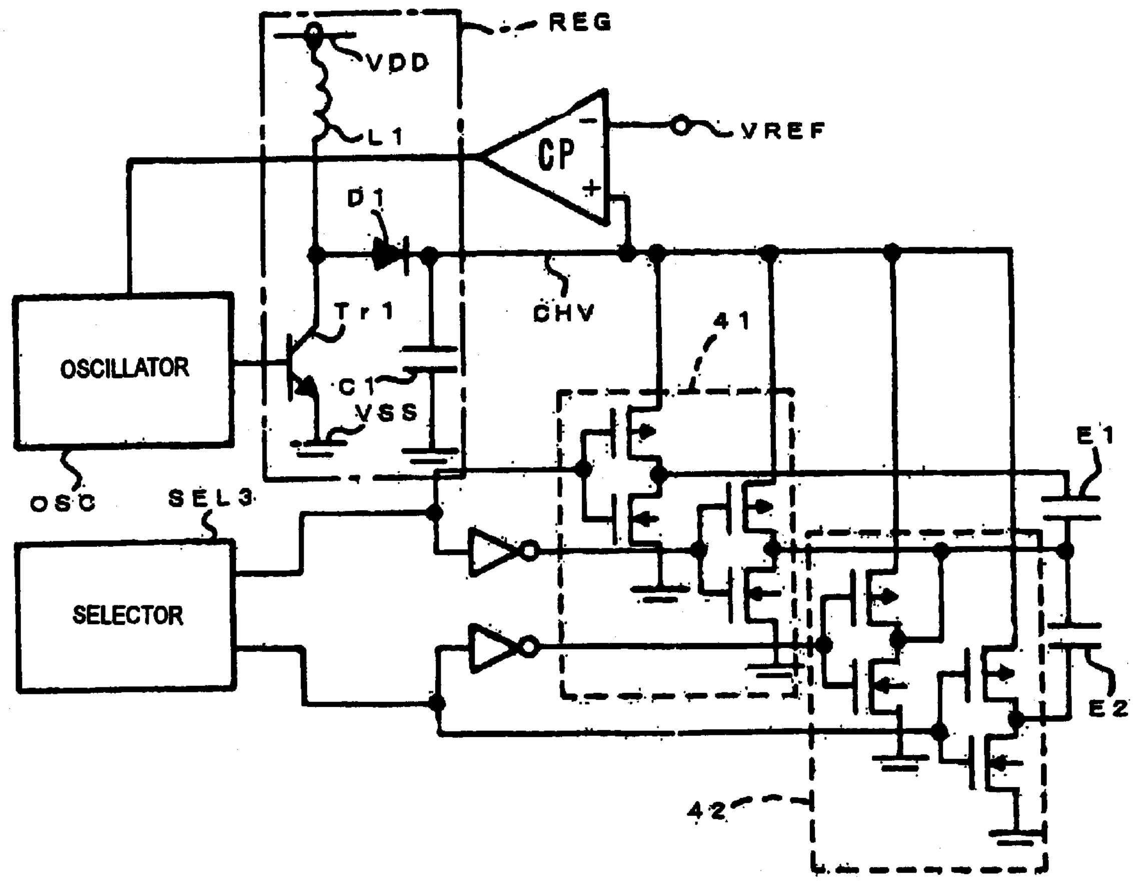
FIG. 4 PRIOR ART
FIG. 4 is a block diagram for explaining a construction of another conventional drive circuit of an EL element.

A high voltage switch output circuit 2 provides power generated by the step-up circuit 1 to an EL element selected by a selector, described later, from EL (electroluminescence) elements E1 and E2. As shown by FIG. 2, the high voltage switch output circuit 2 comprises invertors IVA, IVB and IVC which are constant current output circuits and a drive signal generating circuit 21 provides drive signals to the respective invertors. An oscillator 3 for EL output is oscillated at a predetermined frequency determined by a resistor R. For each of the invertors IVA, IVB and IVC, the respective drains of a P-channel MOS transistor P1 and an N-channel MOS transistor N1 are connected forming an output terminal OUT1, OUT2 and OUTCOM, respectively. The source of the P-channel MOS transistor P1 of each invertors is connected to the output terminal CHV of the step-up circuit 1 and the source of the N-channel MOS transistor N1 is connected to the terminal VSS(OV). The drive signal generating circuit 21 generates the drive signal based on a signal for EL output. The oscillation output is divided by dividing an oscillation output generated by the oscillator 3 for EL output by a dividing stage 4 and a selecting signal from a selector, described later. The Pchannel MOS transistor P1 of each of the invertors IVA, IVB and IVC is made ON and OFF by the drive signal. Voltage generated by the step-up circuit 1 is outputted from the output terminal OUT1, OUT2 or OUTCOM, or the output terminal is brought into a high impedance state. One terminal of the EL element E1 is connected to the output terminal OUT1 and the other terminal is connected to the output terminal OUTCOM to form an H bridge circuit with respect to the EL element E1. One terminal of the EL element E2 is connected to the output terminal OUT2, and the other terminal is connected to the output terminal OUTCOM (hereinafter, referred to as a common output terminal OUTCOM) to form an H bridge circuit with respect to the EL element E2. The EL elements are driven as follows. The common output terminal OUTCOM generates a drive voltage at a frequency of a signal for EL output. Hereinafter, a phase thereof is defined as a positive phase. When the EL element E1 is instructed to switch on by a selecting signal from a selector, the output terminal OUT1 generates a drive voltage having a phase inverse to the phase of the common output terminal OUTCOM. Thereby, the EL element E1 is charged, discharged and switched on. Meanwhile, when the EL element E2 is instructed to switch off by the selecting signal, the output terminal OUT2 is brought into the high impedance state, and the potential of the output terminal OUT2 is also varied by an amount of varying the potential of the common output terminal OUTCOM since the EL element is a capacitive load and the EL element E2 is not charged, discharged or switched on.

A decoder 5 decodes states of 'H' and 'L' of input terminals ENA1 and ENA2 and outputs a decode signal indicating an EL element for emitting light to a selector 8. The input terminals ENA1 and ENA2 are connected with EL element selecting switches 6 and 7 and the ON state of the switches respectively select light emittance of the EL elements E1 and E2.

The selector 8 controls the high voltage switch output circuit 2 by generating a selecting signal in accordance with a signal from the decoder 5 which provides the signal for EL output of the dividing stage 4 to a constant current output circuit for driving the selected EL element. Along therewith, the selector 8 selects one of oscillation outputs of coil driving oscillators OSC1 through OSC3 in accordance with the selected EL element or a selected combination of the EL elements and outputs the one oscillation output to a dividing stage 9. For example, when the EL element E1 is driven, the coil driving oscillator OSC1 is selected, when the EL element E2 is driven, the coil driving oscillator OSC2 is selected, and when the EL elements E1 and E2 are simultaneously driven, the coil driving oscillator OSC3 is selected. The dividing stage 9 divides the oscillation output of the selected coil driving oscillator and generates a coil drive signal. Thereby, a coil drive signal for driving the transistor Tr1 of the step-up circuit 1 is set to a frequency optimum for generating power in accordance with the EL element or a combination thereof for emitting light. That is, when the EL element having a larger size is driven, the coil drive signal having a higher predetermined frequency is used. When the EL elements E1 and E2 are simultaneously made to emit light, the coil drive signal having a higher predetermined frequency is used. Thereby, the EL elements E1 and E2 can emit light with predetermined brightness regardless of a light emitting pattern in which a single one of the EL elements E1 or E2 is made to emit light or in which the EL elements E1 and E2 are made to emit light simultaneously.

The coil driving oscillators OSC1 through OSC3 are connected with resistors R1 through R3 for setting oscillation frequencies at respective terminals OCL1 through OCL3 that are oscillated at frequencies in accordance with the respective resistors R1 through R3 and form a coil driving oscillator group 10.

According to the first embodiment, a coil drive signal generating circuit 21 is formed by the decoder 5, the EL element selecting switches 6 and 7, the selector 8, the dividing stage 9 and the coil driving oscillator group 10. Further, the above-described structure (other than the direct current power source BATT, the EL element selecting switches 6 and 7, the coil L1, the diode D1, the high withstand voltage condenser C1, the resistors R, R1, R2 and R3 and the EL Elements E1 and E2) is integrated as a driving integrated circuit 11, an IC chip.

An explanation will be given of the operation of the first embodiment as follows: The decoder 5 decodes ON and OFF states of the EL element selecting switches 6 and 7 and outputs a signal indicating a result of decoding to the selector 8. Upon receiving the signal, the selector 8 selects a terminal for providing the constant current output to the EL element from the output terminals OUT1, OUTCOM and 0UT2 of the high voltage switch output circuit, selects the oscillation output of the coil driving oscillator set with a frequency in accordance with the light emitting pattern of the driven EL element or a plurality of the EL elements simultaneously driven from the coil driving oscillator group 10 and inputs the oscillation output to the transistor Tr1 via the dividing stage 9.

In the step-up circuit 1, a surge pulse generated by switching on the transistor Tr1 is charged from the direct current power source BATT to the high withstand condenser C1 via the coil L1 and the diode D1. The input power is controlled by the coil drive signal of the transistor Tr1. The high withstand voltage condenser C1 is charged with predetermined power in accordance with a light emitting pattern by control of the selector 8. By receiving high voltage generated at the high withstand condenser C1, the high voltage switch output circuit 2 outputs bi-directionally high voltage and constant current to the selected EL element.

According to the embodiment, the respective element can be set with predetermined brightness. Further, when the EL elements E1 and E2 are simultaneously made to emit light, two of the EL elements are viewed as a single capacitor from the drive circuit and accordingly, the brightness of the two EL elements cannot be set individually. However, power generated by the step-up circuit 1 can be set such that brightness of the two EL elements becomes a desired value.

According to the conventional circuit, power generated by the stepup circuit is fixed and therefore, for example, the brightness of the EL element differs by the light emitting pattern in which one of the EL elements E1 and E2 having different sizes are made to emit light or the EL elements E1 and E2 are made to emit light simultaneously. According to the first embodiment of the invention, constant brightness can be maintained regardless of the light emitting pattern by selecting optimum power in accordance with the light emitting pattern. Further, desired brightness can be set for respective light emitting patterns.

Further, the invention is not limited to the above described embodiment but is also applicable to a drive circuit for driving a plurality of other capacitive loads. For example, piezoelectric oscillators used in an ultrasonic motor may be driven. Also in this case, desired power can be provided for respective drive patterns in which one of a plurality of capacitive loads are driven or a combination of several loads are driven.

Further, the invention is not limited to two capacitive loads but is applicable to a drive circuit for driving three or more capacitive loads by providing the coil driving oscillators in accordance with a pattern for driving the capacitive loads. Further, a frequency band from which the coil drive signal is selected may be widened by further increasing the number of coil driving oscillators having higher frequencies and the number of dividing stages for dividing the coil drive frequencies.

Further, according to the invention, if the step-up circuit is made common for many EL elements or combinations of EL elements (exceeding the two elements shown in the drawings for simplicity sake only), only a set plurality of coil driving oscillators needed for generating the coil drive signal for driving the coil of the step-up circuit are provided. In comparison with an arrangement of providing a step-up circuit individually for each respective capacitive load or pair of capacitive loads, the invention significantly reduces the area of the IC but also the number of parts such as the coil, diode, and high withstand voltage condenser of the step-up circuit can significantly be reduced in integrating the drive circuit.

Further, in accordance with the invention, by adopting a constant current drive system, resistance against deterioration of a capacitive load and ageing can be increased. For example, in the case of an EL element, undesired decrease in brightness can be reduced.

According to the invention, respective brightness can be set for a respective EL element without providing a plurality of step-up circuits for driving a plurality of capacitive loads. Further, in IC formation, the area of the IC can significantly be reduced, and parts such as the coil, diode, high withstand condenser and the like of a step-up circuit can significantly be reduced.

Further, lowering of brightness due to deterioration in an EL element can be reduced owing to the constant current drive system.

What is claimed is:

1. A drive circuit of capacitive load comprising:

a step-up circuit in which a coil and a transistor are connected in series between a terminal at a first potential and a terminal at second potential lower than said first potential; a diode and a condenser are connected in series between a point of connecting said coil and said transistor and said terminal at said second potential; and a surge pulse generated at said coil by switching on and off said transistor by a coil drive signal, is applied to said condenser via said diode to thereby charge said condenser by which output voltage is generated at a point of connecting said diode and said condenser;

a high voltage switch output circuit for selectively driving a plurality of capacitive loads by selectively supplying said output voltage from said step-up circuit as driving voltage with constant current to said capacitive loads under control of selecting circuit; and a coil drive signal generating circuit for generating said coil drive signal at a frequency in correspondence with a single one of said capacitive loads driven or a combination of said capacitive loads simultaneously driven by said high voltage switch output circuit, wherein said coil drive signal generating circuit comprises said selecting circuit and a plurality of oscillators, said plurality of oscillators are set to generate an oscillation output at a predetermined frequency in correspondence with either one of said plurality of capacitive loads and a combination of said capacitive loads, said selecting circuit selects said capacitive load to be driven and selects said oscillators for generating a frequency in correspondence with said selected capacitive load or said combination of said capacitive loads simultaneously selected, and said coil drive signal is generated based on said oscillation output from said selected oscillator.

2. A drive circuit of a capacitive load according to claim 1:

wherein the capacitive load is an electroluminescence (EL) element and the coil drive signal is generated at a frequency for making the EL element or a plurality of EL elements emit light with a predetermined brightness of one of the driven EL element or a combination of the EL elements simultaneously driven.

3. A drive circuit of capacitive load comprising:

a step-up circuit in which by externally attaching a plurality of capacitive loads, a coil and a transistor that are connected in series between a terminal at a first potential and a terminal at second potential lower than said first potential; a diode and a condenser are connected in series between a point of connecting said coil and said transistor and said terminal at said second potential; and a surge pulse generated at said coil by switching on and off said transistor by a coil drive signal, is applied to said condenser via said diode to thereby charge said condenser by which output voltage is generated at a point of connecting said diode and said condenser;

a high voltage switch output circuit for selectively driving a plurality of capacitive loads by selectively supplying said output voltage from said step-up circuit as driving voltage with constant current to said capacitive loads under control of a selecting circuit; and a coil drive signal generating circuit for generating said coil drive signal at a frequency in correspondence with a single one of said capacitive loads driven or a combination of said capacitive loads simultaneously driven by said high voltage switch output circuit, wherein said coil drive signal generating circuit comprises said selecting circuit and a plurality of oscillators, said plurality of oscillators are set to generate an oscillation output at a predetermined frequency in correspondence with either one of said plurality of capacitive loads and a combination of said capacitive loads, said selecting circuit selects said capacitive load to be driven and selects said oscillators for generating a frequency in correspondence with said selected capacitive load or said combination of said capacitive loads simultaneously selected, and said coil drive signal is generated based on said oscillation output from said selected oscillator.

4. The integrated circuit for driving a capacitive load according to claim 3:

wherein the capacitive load is an electroluminescence (EL) element and the coil drive signal is generated at a frequency for making the EL element or a plurality of elements emit light with a predetermined brightness of one of the driven EL element or a combination of the EL elements simultaneously driven.

* * * * *